United States Patent [19]

Whitney

[11] Patent Number: 5,583,072

[45] Date of Patent: Dec. 10, 1996

[54] METHOD OF MANUFACTURING A MONOLITHIC LINEAR OPTOCOUPLER

[75] Inventor: David Whitney, San Jose, Calif.

[73] Assignee: Siemens Components, Inc., Cupertino, Calif.

[21] Appl. No.: 491,324

[22] Filed: Jun. 30, 1995

[51] Int. Cl.$^6$ ................................................ H01L 21/76
[52] U.S. Cl. .................. 437/63; 437/62; 437/974; 437/67; 148/DIG. 12
[58] Field of Search ................................ 437/63, 67, 62, 437/61, 974; 148/DIG. 12

[56] References Cited

U.S. PATENT DOCUMENTS 5,246,877  9/1993  Hisamoto et al. .................... 437/62
5,420,064  5/1995  Okonogi et al. ..................... 437/63
5,700,814  3/1992  Yamaguchi et al. .................. 437/62

FOREIGN PATENT DOCUMENTS 0008842  7/1981  Japan ................................. 437/61

*Primary Examiner*—Trung Dang
*Attorney, Agent, or Firm*—Joseph S. Codispoti

[57] ABSTRACT

A method of making a monolithic structure for an optocoupler that provides improved linearity. The method includes forming an output signal photodiode and a feedback control signal photodiode on a single chip with an LED. The photodiodes are configured and positioned relative to the LED to compensate for any non-uniformities in the light received from the LED.

8 Claims, 3 Drawing Sheets

METHOD OF MANUFACTURING A MONOLITHIC LINEAR OPTOCOUPLER

TECHNICAL FIELD

A related application entitled "A MONOLITHIC LINEAR OPTOCOUPLER" by the same inventor, is being filed on the same day herewith and is incorporated by reference herein.

The present invention relates to an optocoupler. The present invention relates, in particular, to a method of making a monolithic structure for an optocoupler that provides improved linearity.

BACKGROUND OF THE INVENTION

Optocouplers are used to electrically isolate an input signal from a corresponding output signal. For example, optocouplers may be used in data access arrangements ("DAAs"). A data access arrangement (DAA) is used for interfacing a data terminal equipment ("DTE") (such as data modems, facsimile machines, non-cellular portable telephones, speaker phones, and message answering machines, for example) with lines of the public-switched telephone network ("PSTN"). The network (PSTN) must be protected from potential damage due to, for example, faulty data terminal equipment (DTE) or inadvertent shorts through the data terminal equipment (DTE) to its power line. Indeed, the United States Federal Communications Commission ("FCC") requires a 1500 volt isolation between data terminal equipment (DTE) and the network (PSTN). In the past, data access arrangements (DAAs) have used transformers to provide such electrical isolation. However, due to their relative expense and large size and weight, transformers are disadvantageous, particularly for use in portable data terminal equipment (DTE). Alternative isolation components, such as optical isolators, must be used for such reduced volume/weight applications.

Known optocouplers include an LED which is optically coupleable with, but electrically isolated from, a photodiode. The photodiode ("the output signal photodiode") generates an output signal based on the intensity of light emitted from the LED and detected by it.

Known optocouplers may also include an additional photodiode ("the feedback control signal photodiode") for generating a servo-feedback signal based on the intensity of light emitted from the LED and detected by it. The feedback control signal photodiode allows the optocoupler to operate more linearly. In these known optocouplers, the output signal photodiode and the feedback control signal photodiode are discrete elements. As such, a first direction defined between the LED and the output signal photodiode differs from a second direction defined between the LED and the feedback control signal diode. Unfortunately, the LED may emit directionally non-uniform light. As a result, the intensity of light detected by the output signal diode usually varies from the intensity of light detected by the feedback control signal diode. Consequently, the output of the feedback control signal photodiode will not accurately indicate the intensity of the light from the LED detected by the output signal photodiode, thereby preventing the full compensation of non-linearities in the operation of the optocoupler.

One solution to the problem of directionally non-uniform light emission is to place the output signal photodiode in close proximity to the feedback control signal photodiode. Unfortunately, this offers only a partial solution because directionally non-uniform light will still cause non-linearities, although to a lesser extent. In addition, the feedback control signal photodiode must be adequately isolated from the output signal photodiode to provide adequate electrical isolation. Such isolation is difficult when the two photodiodes are located close to one another.

In view of the above described problems with known optocoupler circuits, an optocoupler immune to directionally non-uniform light emission by the LED is needed. Furthermore, any photodiodes of the optocoupler should be adequately electrically isolated from one another. Moreover, the optocoupler should be relatively simple and economical to manufacture. If possible, the optocoupler should be integrated on a single chip.

SUMMARY OF THE INVENTION

Briefly, the present invention provides a method for fabricating a monolithic semiconductor device, comprising steps of forming trenches in the top surface of a silicon wafer; forming an N+ region on the top surface of the wafer and the inner surfaces of the trenches; forming a first oxide layer on the N+ region; removing the silicon wafer such that portions of the N+ region are exposed; forming P+ regions that cover the exposed portions of the N+ region; adding a second oxide layer on the P+ regions; and adding a substrate on the second oxide layer.

The step of forming P+ regions may include forming a first photodiode having a cathode and an anode, and a second photodiode having a cathode and an anode.

The method may also include providing electrical connections to the cathodes and anodes of the first and second photodiodes. The method may also include forming a light emitting diode on the upper surface of the device.

A reflective dome may be provided above the monolithic structure thereby forming an optical cavity. The reflective dome increases the signal to noise ratio of the optocoupler.

BRIEF DESCRIPTION OF THE DRAWINGS

For a better understanding of the invention, reference is made to the following description of an exemplary embodiment thereof, and to the accompanying drawings, wherein.

DETAILED DESCRIPTION

Figure 3:
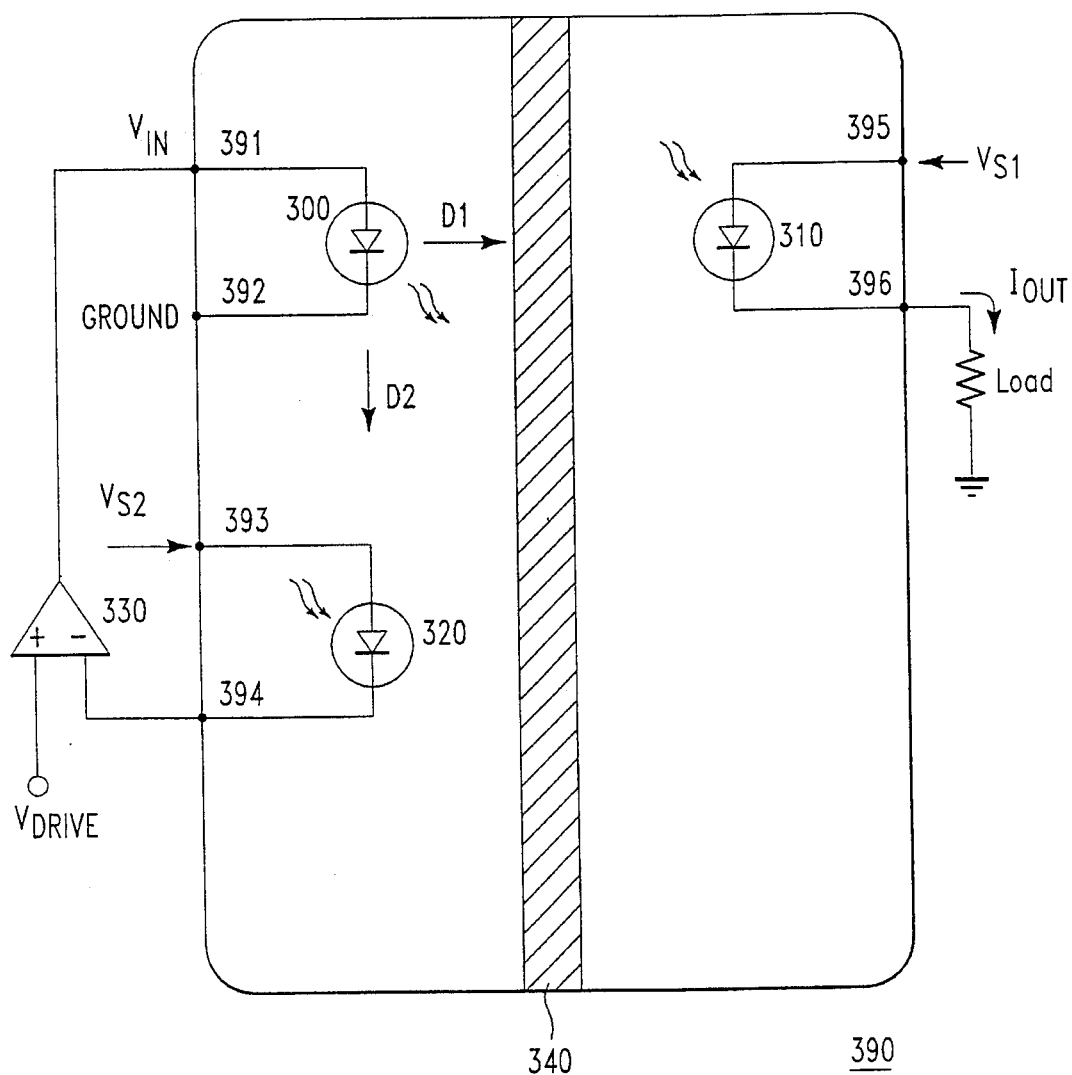
FIG. 3 is a schematic diagram of a conventional optocoupler chip having an externally coupled feedback control loop.

FIG. 3 is a schematic diagram of a conventional optocoupler chip 390 having an externally coupled feedback control loop. The conventional optocoupler includes a LED 300, an output signal photodiode 310, and a feedback control signal photodiode 320. A differential (error) operational amplifier 330 is coupled from a control signal output terminal 394 to a LED input signal terminal 391.

The LED 300 emits a light having an intensity based on the voltage of a signal output from the differential amplifier 330. The differential amplifier 330 may either source or sink the LED current. The output signal photodiode 310 is electrically isolated from, and optically coupleable with, the LED 300. A first direction D1 is defined from the LED 300 to the output signal photodiode 310. The anode of the output signal photodiode 310 is coupled with a first voltage source $V_{S1}$ via terminal 395 and the cathode of the output signal photodiode 310 is coupled with an output load via terminal 396. Alternatively, if a depletion layer photodiode is used, the cathode of the output signal photodiode 310 can be coupled with a voltage source and the anode of the output signal photodiode 310 can be coupled with the output load, such that the reverse biased depletion layer photodiode operates below its breakdown voltage. In either case, the output signal photodiode 310 supplies an output signal to the output load (or to an output driver) based on the intensity of light detected by it.

The feedback control signal photodiode 320 is also optically coupleable with the LED 300. Although the feedback control signal photodiode 320 may also be electrically isolated from the LED 300, such electrical isolation is not required. A second direction D2 is defined from the LED 300 to the feedback control signal photodiode 320. The anode of the feedback control signal photodiode 320 is coupled with a second supply voltage $V_{S2}$ via terminal 393 and the cathode of the feedback control signal photodiode 320 is coupled with a first (inverting) input of the differential amplifier 330. Alternatively, if a depletion layer photodiode is used, the cathode of the feedback control signal photodiode 320 can be coupled with a voltage source and the anode of the feedback control signal photodiode 320 can be coupled with the first input of the differential amplifier 330, such that the reverse biased depletion layer photodiode operates below its breakdown voltage. A second (non-inverting) input of the differential amplifier 330 is provided with an input signal $V_{DRIVE}$.

Unfortunately, the LED 300 does not emit light in a directionally uniform manner. Consequently, the intensity of the light emitted in direction D1 may vary from the intensity of the light emitted in the direction D2. This difference in detected intensity makes it difficult to properly control the voltage applied to the LED 300. As discussed above, if the output signal photodiode 310 is placed in close proximity to the feedback control signal photodiode 320 such that the direction D1 closely approaches the direction D2, electrically isolating the two photodiodes may become difficult.

Figure 1:
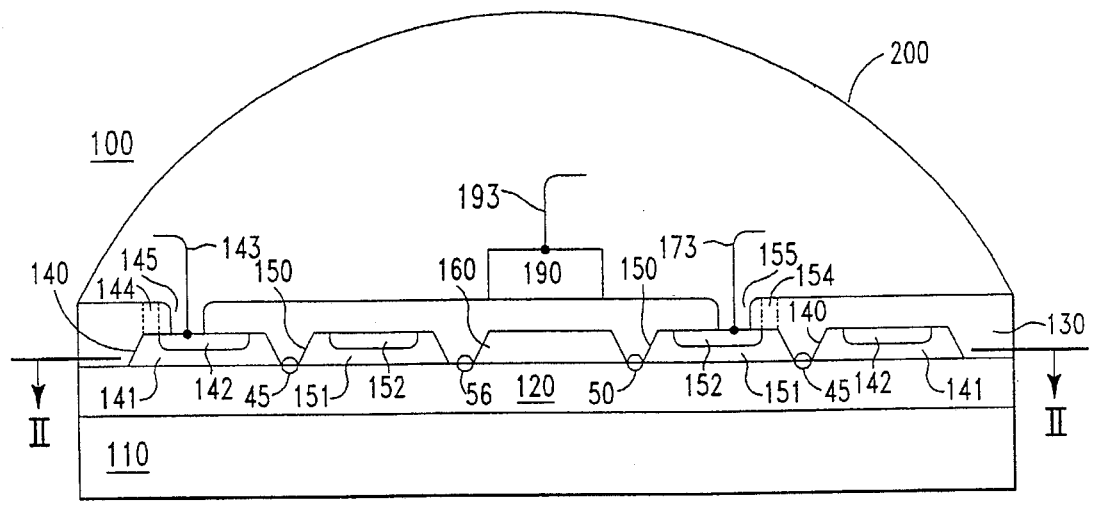
FIG. 1 is a side view, through the cross-section defined by line I—I of FIG. 2, of an optocoupler constructed in accordance with the present invention.

FIG. 1 is a cross-sectional side view of the monolithic structure 100 of an optocoupler of the present invention. The cross section is taken across a middle of the monolithic structure as shown by line I—I of FIG. 2.

The monolithic structure 100 includes a silicon substrate 110, a layer of oxide 120 (such as silicon dioxide for example), an inner silicon section 160, an inner silicon tub 150, an outer silicon tub 140, a thick oxide (such as silicon dioxide) covering 130, and a light emitting diode (LED) 190.

The layer of oxide 120 is located above the silicon substrate 110 such that an interface is defined between an upper surface of the silicon substrate 110 and a lower surface of the oxide layer 120. The inner silicon section 160 is located on, and preferably in a center region of, an upper surface of the oxide layer 120. The inner silicon tub 150 is located on the upper surface of the oxide layer 120 and surrounds the inner silicon section 160. The inner edges 159 of the inner silicon tub 150 are spaced from the outer edges 168 of the inner silicon section 160 thereby defining an first area 56 of the upper surface of the oxide layer 120 that is not in contact with a silicon structure. The outer silicon tub 140 is located on the upper surface of the oxide layer 120 and surrounds the inner silicon tub 150. The inner edges 149 of the outer silicon tub 140 are spaced from the outer edges 158 of the inner silicon tub 150 thereby defining a second area 45 of the upper surface of the oxide layer 120 that is not in contact with a silicon structure.

The inner silicon tub 150 includes a rectangular p-doped "tub" region 151. Alternatively, the silicon tub 150 may have an octagonal p-doped "tub" region 151. Providing an octagonal p-doped "tub" region 151, however, requires an additional step of etching corner regions during fabrication. Indeed, the shape of the p-doped "tub" region 151 may assume any shape that surrounds the LED 190 and that can be fabricated from the crystalline structure. However, symmetric shapes, and in particular, shapes symmetric with respect to two perpendicular lines intersecting at the center of the shape are preferred.

An n-doped region 152 is located within the p-doped tub 151 thereby forming a p-n junction 151–152. This p-n junction 151–152 defines a first diode; the p-doped tub 151 forming the anode of the first diode and the n-doped region 152 forming the cathode of the first diode. Similarly, the outer silicon tub 140 includes a rectangular p-doped "tub" region 141 but can assume other shapes (such as octagonal) as discussed above. An n-doped region 142 is located within the p-doped tub 141 thereby forming a p-n junction 141–142. This p-n junction 141–142 defines a second diode; the p-doped tub 141 forming the anode of the second diode and the n-doped region 142 forming the cathode of the second diode.

Figure 2:
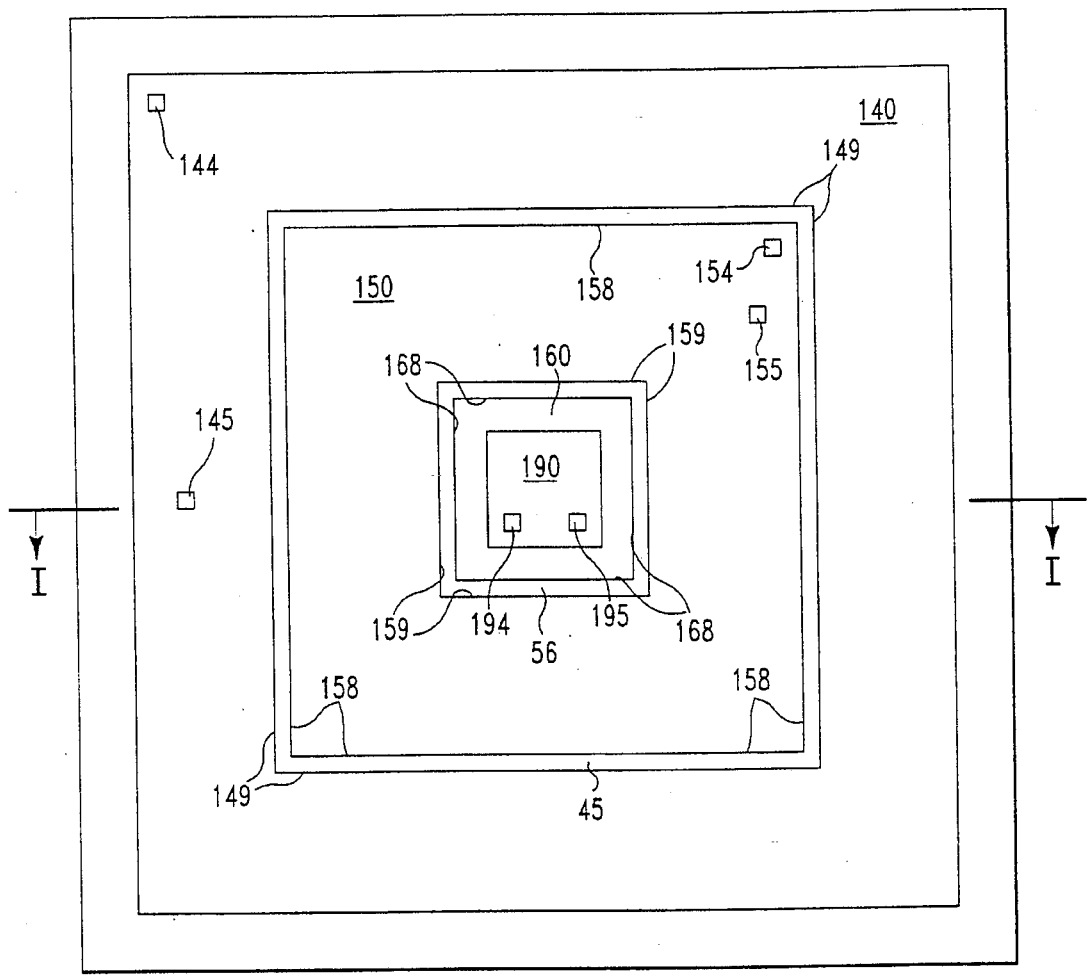
FIG. 2 is a plan view, through a cross section defined by line II—II shown in FIG. 1, of the optocoupler of FIG. 1.

The thick oxide covering 130 covers the inner silicon region 160, the inner silicon tub 150, the outer silicon tub 140, and the first and second areas 56 and 45 of the upper surface of the oxide layer 120 not covered with silicon. However, voids for providing access to cathode (144,154) and anode (145,155) bond pads are formed in the thick oxide layer to permit anode and cathode connections to be formed to the first and second diodes. Specifically, as shown in FIGS. 1 and 2, the void 145 provides access to a cathode bond pad on the n-doped region 142 of the outer silicon tub 140. A similar void 144 provides access to an anode bond pad on the p-doped tub 141 of the outer silicon tub 140. Similarly, as shown in FIGS. 1 and 2, the void 155 provides access to a cathode bond pad on the n-doped region 152 of the inner silicon tub 150. A similar void 154 provides access to an anode bond pad on the p-doped tub 151 of the inner silicon tub 150.

The LED 190 is arranged on an upper exposed surface of the thick oxide covering 130. As shown in FIG. 2, the LED 190 includes a cathode bonding pad 194 and an anode bonding pad 195. The thick oxide covering 130 should permit light at the wavelength of the light (typically infrared) emitted by the LED 190 to pass. That is, the thick oxide covering 130 should be substantially transparent to light emitted by the LED 190.

An optional reflective dome 200, covering the monolithic structure 100, may also be provided. The reflective dome 200 may be made from an optically transparent material having a reflective layer for example.

The first diode 151,152 formed by the inner silicon tub 150 is a photodiode and may be used to either generate an output signal or a feedback control signal. However, given its close proximity to the LED 190, the first photodiode 151, 152 is preferably used for generating a feedback control signal for the LED 190. This is because the feedback control signal photodiode does not need to be electrically isolated from the LED 190. The second diode 141, 142 formed by the outer silicon tub 140 is a photodiode and may be used to either generate a feedback control signal or an output signal. The second photodiode 141, 142 should perform the function not being performed by the first photodiode 151, 152. Accordingly, the second photodiode is preferably used for generating an output signal. This provides even better electrical isolation between the output signal photodiode and the LED 190.

In operation, when the LED 190 emits light, some of the emitted light passes through the optically transparent thick oxide layer 130 to the first and second photodiodes. The first and second photodiodes produce electrical output signals based on the intensity of the light that they receive. Since both the first and second photodiode structures surround the LED, any directional non-uniformities in the intensity of light emitted by the LED are compensated for because the intensities of light emitted in all directions is averaged by the surrounding photodiodes.

If the optional reflective dome 200 is provided, an optical cavity between the upper surface of the monolithic structure 100 and the inner surface of the reflective dome 200 is defined. Consequently, some of the light emitted by the LED 190 is reflected by the reflective dome 200 to the first and second photodiodes. Thus, by increasing the net intensity of the light received by the first and second photodiodes, the reflective dome 200 improves the signal to noise ratio of the optocoupler.

The inner and outer silicon tubs 150 and 140, respectively (i.e., the first and second photodiodes) are surrounded by an oxide; in particular, a bottom surface of the inner and outer silicon tubs 150 and 140, respectively, rest on the oxide layer 120, and side and top surfaces (except in the areas of the voids used for accessing anode and cathode bond pads) of the inner and outer silicon tubs 150 and 140, respectively, are surrounded by the thick oxide 130. As a result, the first and second photodiodes are electrically isolated from each other and from the LED 190.

Figure 4A:
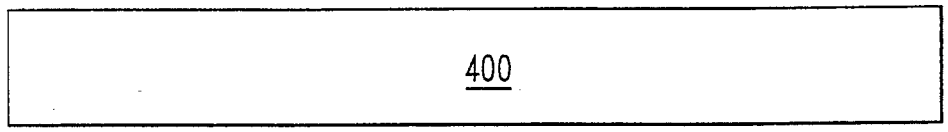
FIGS. 4a through 4d illustrate a method for fabricating the monolithic structure of an optocoupler of the present invention.
Figure 4B:
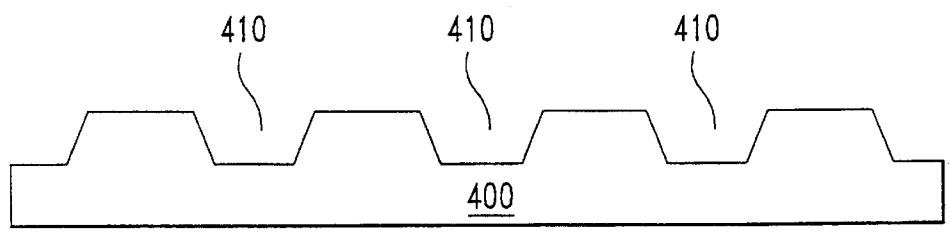
Figure 4C:
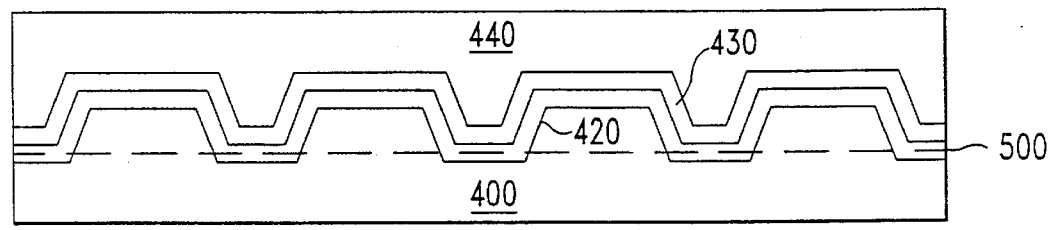
Figure 4D:
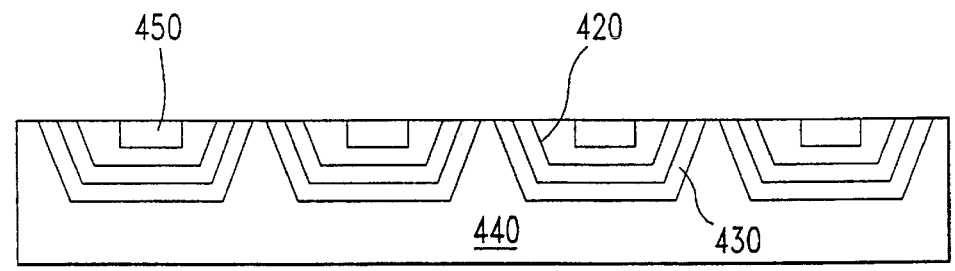

FIGS. 4a through 4d illustrate an exemplary method of fabricating the monolithic 100 structure of FIGS. 1 and 2. As shown in FIGS. 4a and 4b, trenches 410 are formed in an n-type silicon wafer 400 in a known manner, e.g., etching, stamping, etc. Next, as shown in FIG. 4c, an n-type material is introduced, e.g., by diffusion, into the wafer 400, thereby forming an N+ region 420. Silicon is then oxidized to form an SiO₂ layer 430. Then, as shown also in FIG. 4c, poly silicon (or "amorphous silicon") 440 is deposited on the upperside of the resulting structure. The poly silicon fills the trenches 410 and provides mechanical stability. Next, as shown by the dashed line 500 of FIG. 4c, the n-type silicon layer 400 is back-lapped to expose portions of the N+ layer 420. As shown in FIG. 4d, the resulting structure is then flipped and is processed using dielectrically isolated tubs, thereby forming P+ regions 450. The silicon oxide layer 120 and the silicon substrate 110 (See FIG. 1) are then added. The resulting structure is then flipped. The poly silicon 440 (130) is then appropriately shaped, e.g., by etching, to form the voids 144, 145, 154, 155 (See FIGS. 1 and 2) that allow bond pads and wire leads to be applied to the cathodes and anodes of the two photodiodes.

The embodiments described herein are merely illustrative of the principles of the present invention. Various modifications may be made thereto by persons ordinarily skilled in the art, without departing from the scope or spirit of the invention.

What is claimed is:

1. A method for fabricating a monolithic semiconductor structure, comprising steps of:
    (a) etching trenches into an n-type silicon wafer;
    (b) diffusing an n-type material into the wafer to form an N+ layer;
    (c) forming a first oxide layer on the N+ layer;
    (d) depositing a silicon material onto the intermediate structure to fill the trenches and provide mechanical stability;
    (e) back-lapping the silicon wafer such that portions of the N+ layer are exposed;
    (f) forming P+ regions, using dielectrically isolated tubs, to cover the exposed portions of the N+ layer;
    (g) adding a second oxide layer on the P+ regions; and
    (h) adding a substrate on the second oxide layer.

2. The method of claim 1, wherein the step of forming P+ regions comprises forming a first photodiode having a cathode and an anode, and a second photodiode having a cathode and an anode.

3. The method of claim 2, further comprising the steps of:
    (i) appropriately etching the silicon material to form voids;
    (j) applying bond pads and wire leads to the cathodes and anodes of the first and second photodiodes via the voids.

4. A method for fabricating a monolithic semiconductor device, comprising steps of:
    (a) forming trenches in the top surface of a silicon wafer;
    (b) forming an N+ region on the top surface of the wafer and the inner surfaces of the trenches;
    (c) forming a first oxide layer on the N+ region;
    (d) removing the silicon wafer such that portions of the N+ region are exposed;
    (e) forming P+ regions that cover the exposed portions of the N+ region;
    (f) adding a second oxide layer on the P+ regions; and
    (g) adding a substrate on the second oxide layer.

5. The method of claim 4, wherein the step of forming P+ regions comprises forming a first photodiode having a cathode and an anode, and a second photodiode having a cathode and an anode.

6. The method of claim 5, further comprising the step of providing electrical connections to the cathodes and anodes of the first and second photodiodes.

7. The method of claim 6, further comprising the step of forming a light emitting diode on the upper surface of the device.

8. The method of claim 7, further comprising the step of affixing an optically transparent dome over the upper surface of the device that has a reflective layer facing the upper surface of the device.

* * * * *